United States Patent [19]

Miller

[11] Patent Number: 4,794,346
[45] Date of Patent: Dec. 27, 1988

[54] BROADBAND SEMICONDUCTOR OPTICAL AMPLIFIER STRUCTURE

[75] Inventor: Stewart E. Miller, Middletown Township, Monmouth County, N.J.

[73] Assignee: Bell Communications Research, Inc., Livingston, N.J.

[21] Appl. No.: 148,756

[22] Filed: Jan. 26, 1988

Related U.S. Application Data

[60] Continuation-in-part of Ser. No. 937,040, Dec. 2, 1986, abandoned, which is a division of Ser. No. 673,584, Nov. 21, 1984, Pat. No. 4,680,769.

[51] Int. Cl.$^4$ .............................................. H01S 3/19
[52] U.S. Cl. .................................. 330/4.3; 372/45; 372/49; 372/50
[58] Field of Search .................. 330/4.3; 372/44, 45, 372/46, 49, 19, 20; 307/425

[56] References Cited

U.S. PATENT DOCUMENTS

| | | | |
|---|---|---|---|
| 3,747,021 | 7/1973 | Smiley | 372/39 |
| 3,904,982 | 9/1975 | Dienes et al. | 372/53 |
| 4,038,610 | 7/1977 | Nishizawa et al. | 330/4.3 |
| 4,121,178 | 10/1978 | Schlossberg | 372/32 |
| 4,125,816 | 11/1978 | Boling et al. | 372/68 |
| 4,194,162 | 3/1980 | Uematsu et al. | 330/4.3 |
| 4,318,059 | 3/1982 | Lang et al. | 372/47 |
| 4,359,776 | 11/1982 | Acket et al. | 330/4.3 X |
| 4,376,307 | 3/1983 | Rozzi et al. | 372/45 |

OTHER PUBLICATIONS

"Dual Wavelength InGaAsP/InP TJS Lasers", Electronic Letters, S. Sakai, T. Aoki and M. Umeno, vol. 18, No. 1, Jan. 7, 1982, pp. 18-20.
"High Quality Antireflection Coating on Laser Facets by Sputtered Silicon Nitride", by G. Eisenstein and L. W. Stulz, App. Op., vol. 23, No. 1, Jan. 1984, pp. 161-164.
Technical Digest OFC '84—O.S.A. Meeting on Optical Fiber Communication, Jan. 23-25, 1984, paper MF2.
"Tunable Optical Waveguide Directional Coupler Filter", by R. C. Alferness and R. V. Schmidt, App. Phys. Lett., vol. 33, No. 2, 15 Jul. 1978, pp. 161-163.

Primary Examiner—James W. Davie
Attorney, Agent, or Firm—James W. Falk; Stephen M. Gurey

[57] ABSTRACT

The broadband semiconductor optical amplifier fabricated in accordance with the teachings of the present invention comprises first and second active semiconductor regions (50, 51) disposed in tandem with each other, and means for injecting current ($I_1, I_2$) into the first and second active semiconductor regions to provide gain distributions over wavelength regions in the two active semiconductor regions which partially overlap to form a combined gain distribution over a wider range of wavelengths. Anti-reflection coatings (54, 55) are disposed on the extreme ends of the combined structure. Tuneable wavelength selective amplification over the wider range is achieved in various embodiments by including a tunable optical bandpass filter (53) or by including various tunable auxiliary light guiding structures (115, 116; 140; or 450) to which and from which light power is coupled from and to the active semiconductor regions of the amplifier, respectively.

31 Claims, 4 Drawing Sheets

4,794,346

BROADBAND SEMICONDUCTOR OPTICAL AMPLIFIER STRUCTURE

This application is a continuation-in-part of application Ser. No. 937,040 filed Dec. 2, 1986 now abandoned, which application was a division of application Ser. No. 673,584, filed Nov. 21, 1984, now U.S. Pat. No. 4,680,769, issued July 14, 1987.

BACKGROUND OF THE INVENTION

This invention relates to the field of optical amplifiers and more specifically to the field of semiconductor optical amplifiers.

Because optical communications systems are being designed to transmit at several different wavelengths, there now exists a need for semiconductor optical amplifiers operating over a wide range of wavelengths. Since semiconductor optical amplifiers are compact, light in weight and are easily produced on a mass production scale, semiconductor amplifiers will play an important role in both optical communications and optical information processing systems.

Generally, a typical optical communications system may utilize several different wavelengths in order to transmit plural channels over a single common optical fiber. Amplifiers are periodically required along the optical transmission path to amplify the signals whose amplitudes have been attenuated due to transmission losses. Accordingly a broadband optical amplifier structure capable of amplifying plural channels at different wavelengths is required. In alternate situations where amplification of only one of the channels and filtering of the other channels is required, a wavelength selective amplifier which is tunable over a broadband range of wavelengths is necessary.

SUMMARY OF THE INVENTION

Semiconductor optical amplifier embodiments of the present invention advantageously provide a broadband amplified light output or, in alternate embodiments, a wavelength selective amplified light output.

Specifically, a semiconductor optical amplifier fabricated in accordance with the teachings of the present invention comprises first and second active semiconductor regions disposed in tandem with each other and means for injecting current into the first and second active regions to provide gain distributions over wavelength regions in the two active semicondutor regions which partially overlap to form a combined gain distribution over a range of wavelengths.

In various alternate embodiments the amplifier further includes means for providing wavelength selective loss or gain for optical signals having a wavelength within that range. In these various alternate embodiments of the present invention, the means for providing wavelength selective loss or gain is either a wavelength selective filter or auxiliary light guiding structures to which and from which light power is coupled from and to the active semiconductor regions, respectively. Moreover, the wavelength of the output optical signal in various embodiments is determined by the values of the injected current density in the two active semiconductor regions and the relative magnitudes of the loss at specific wavelengths.

BRIEF DESCRIPTION OF THE DRAWING

A complete understanding of the present invention may be gained from considering the following detailed description in connection with the accompanying drawing in which.

To facilitate understanding, identical reference numerals are used to designate identical elements common to the figures.

DETAILED DESCRIPTION

Figure 1:
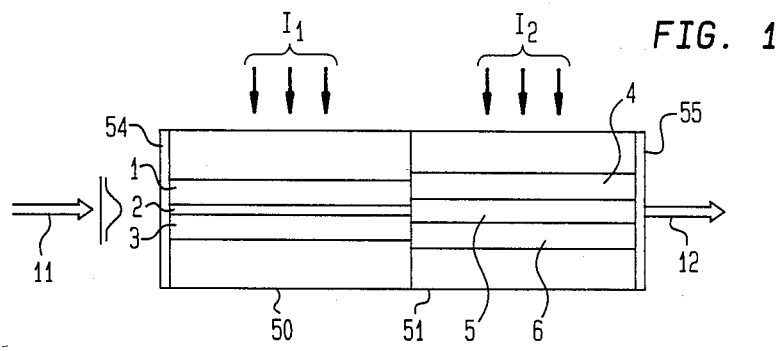
FIG. 1 shows, in block form, a general structure of a broadband amplifier embodiment of the present invention.

To simplify and clarify the drawing, only sufficient detail is shown in the figures to enable one skilled in the art to understand the operation of the inventive structure shown therein. This drawing, along with the following materials and the knowledge of those skilled in the art, enable structures suitable for various applications to be fabricated.

FIG. 1 shows, in block form, the general structure of broadband semiconductor optical amplifiers constructed in accordance with the present invention. In particular, active semiconductor regions 50 and 51, comprising layers 1, 2 and 3 and 4, 5 and 6, respectively, are disposed end to end in tandem with each other. Each end of the structure is coated with an anti-reflection coating 54 and 55. Anti-reflection coatings used to fabricate light emitted diodes are well known in the art, as is the use of multilayered dielectric coatings for fabricating narrowband transmission filters. An example of a single layer anti-reflection coating is shown in an article entitled "High-Quality Anti-Reflection Coating on Laser Facets by Sputtered Silicon Nitride" by G. Eisenstein and L. W. Stulz, *Appl. Opt,* Vol. 23, No. 1, Jan. 1, 1984, pp. 161–164.

Active semiconductor regions 50 and 51 are pumped by injected currents $I_1$ and $I_2$, respectively. An optical signal 11 from an optical fiber or other optical transmitting medium is input to layer 2 through the anti-reflection coating 54 along the edge of region 50 from either an optical fiber or other optical transmission medium. The output optical signal 12 exits layer 5 through anti-reflection coating 55 along the edge of region 51 for coupling to an optical fiber or other optical transmission medium.

Figure 2:
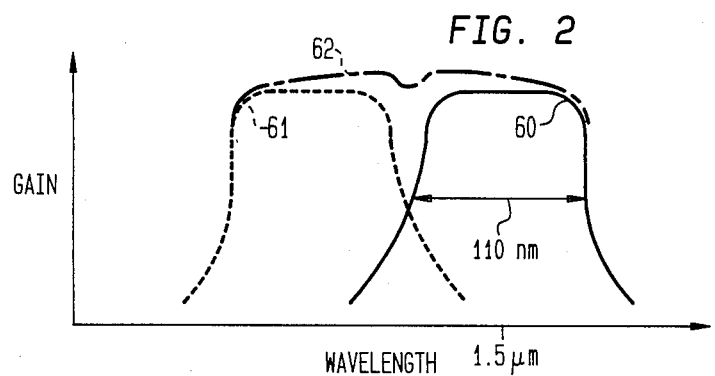
FIG. 2 shows, in graphical form, the gain distribution of each active semiconductor region and the combined gain distribution of the structure shown in FIG. 1.

FIG. 2 shows, in graphical form, the gain distributions 60 and 61 of active semiconductor regions 50 and 51, respectively, as a function of wavelength, for the structures shown in FIG. 1. In particular, for an embodiment where layers 2 and 5 comprise alloys of InGaAsP, the line width of gain distributions 60 and 61 is about 110 nanometers. Gain distribution 60 in FIG. 2 is centered at 1.5 microns.

In a typical single section semiconductor amplifier, gain is provided over a narrower bandwidth than is shown for either gain distrubution 60 or 61. However, when both active semiconductor regions 50 and 51 in FIG. 1 are pumped above the zero gain level so that gain distributions 60 and 61 overlap, as shown in FIG. 2, the combined gain distribution of the structure, shown by curve 62 in FIG. 2, is broader than the gain distribution of either active semiconductor region alone. Thus, amplification is provided in the broad region of the curve 62.

Figure 3:
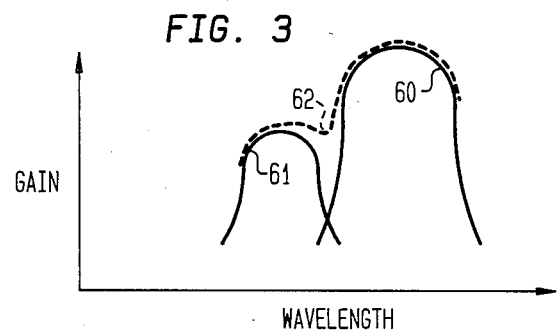
FIGS. 3 and 4 show, in graphical form, the gain distribution of each active semiconductor region and the combined gain distribution of the structures shown in active semiconductor region and the combined gain distribution of the structures shown in FIG. 1 for various values of injection current in the active semiconductor regions.
Figure 4:
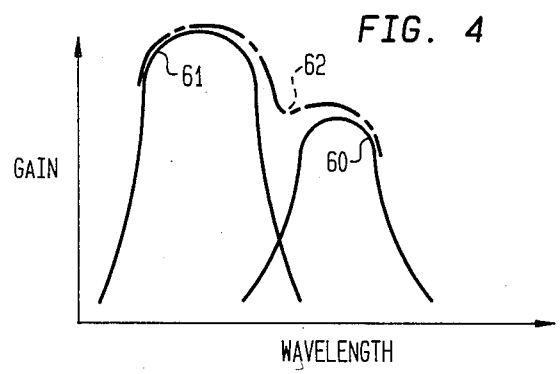

In further embodiments of the present invention, the shape of combined gain distribution 62 can be changed dynamically from the shape shown in FIG. 2 to the shapes shown in FIGS. 3 and 4 by varying the amount of current $I_1$ and $I_2$ injected into active semiconductor regions 50 and 51, respectively. Adjustment of currents $I_1$ and $I_2$ can be made to compensate for imperfections created in the fabrication of the device or to prefer a particular band of amplification in the wavelength selective embodiments of the amplifier to be described hereinafter.

Figure 5:
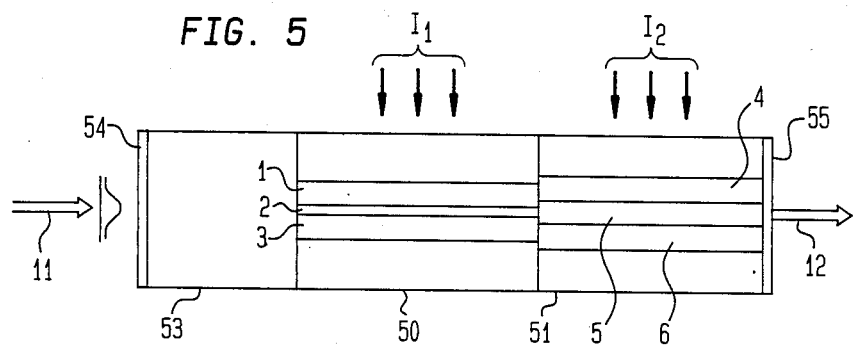
FIG. 5 shows, in block form, the general structure of various embodiments of the wavelength selective amplifier of the present invention.

FIG. 5 shows, in block form, the general structure a wavelength selective amplifier. In this structure a wavelength selective bandpass filter 53 is disposed at the input end of semiconductor region 50. Anti-reflection coating 54 is disposed at the end of bandpass filter 53. Bandpass filter 53 filters from input 11 signals at wavelengths other than in the pass band before amplification in semiconductor regions 50 and 51. The addition of filter 53 prior to the amplification semiconductor regions 50 and 51 allows the provision of much more gain at the wavelength passed by filter 53 than would be possible without it. In the absence of filter 53, signals at the undesired wavelengths could overload the amplifier.

Figure 6:
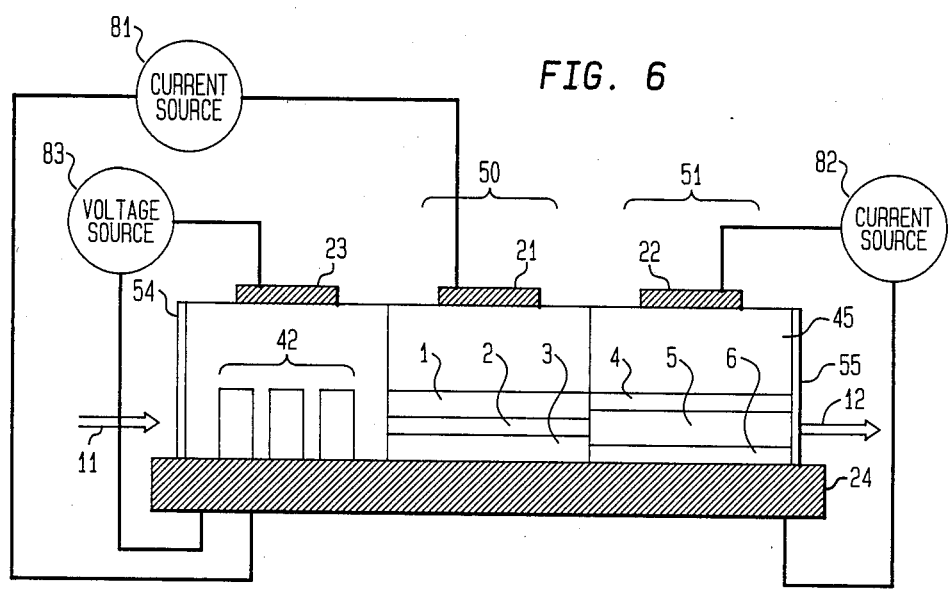
FIG. 6 shows, in pictorial form, a semiconductor embodiment of the present invention utilizing a variable pass band grating structure.

FIG. 6 shows an embodiment of the present invention fabricated from semiconductor materials. In particular, this figure shows a slice through the embodiment taken substantially perpendicular to the top and bottom surfaces and along its longitudinal axis, i.e., the latter being the direction of light beam propagation in the semiconductor regions. For example, active semiconductor regions 50 and 51 may each be fabricated from layers of III–V compounds or alloys of III–V materials. FIG. 6 shows both active laser regions 50 and 51 disposed on heat sink 24 which also serves as one electrode for the various voltage and current sources.

As shown in this figure, grooved grating 42 provides wavelength selective bandpass filtering at the input to the semiconductor regions 50 and 51. This grating is fabricated from $LiNbO_3$ and its grooves may be filled with air or a low index dielectric such as epoxy, $SiO_3$ or SiN. In this embodiment, the electro-optic effect is used to alter the wavelength selective bandpass filtering of the grating. Metallic electrode 23 is deposited on substrate 45 and is illustratively on the order of 3 to 10 microns wide. Variable voltage source 83 is connected to electrodes 23 and 24 to vary the bandpass region of grating 42.

As an alternative, the grating 42 could be formed directly in the semiconductor chip using well-known regrowth techniques to provide a larger bandgap for this region. In this case, the tuning can again be either using the electro-optic effect or by using current injection to change the index of refraction for the grating region.

Metallic electrodes 21 and 22 are placed on top of active semiconductor regions 50 and 51, respectively. Variable current sources 81 and 82 are connected to metallic electrode pairs 21 and 24 and 22 and 24, respectively, to apply varying amounts of injection current to active semiconductor regions 50 and 51.

In order to provide single mode laser output, the transverse structure of the amplifier must be designed to maintain a single transverse mode. Many methods are known in the art for fabricating structures having a single transverse mode, e.g., buried heterostructures, dual-channeled buried heterostructures, ridge or rib waveguides and stripe contact defined structures.

Figure 7:
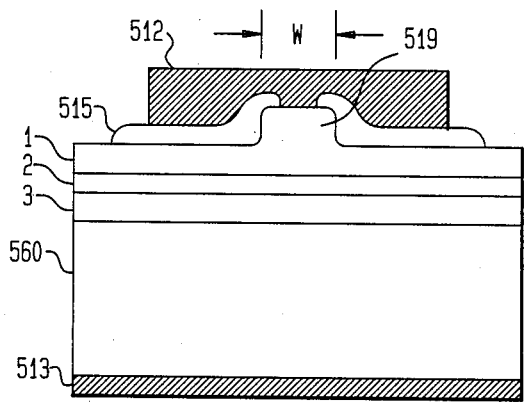
FIG. 7 shows, in pictorial form, a cross section of an active semiconductor region of an embodiment of the present invention in which a ridge waveguide structure is used to provide transverse guidance of the lightwave in the active semiconductor region.

Any one of the many standard laser or amplifier structures may be used to guide the light beam in the transverse plane perpendicular to the direction of propagation of the light beam. For example, version of a ridge waveguide is shown in FIG. 7 which depicts a slice taken, through one of the active semiconductor regions of an embodiment of the present invention, in a plane perpendicular to the direction of propagation of the lightwave beam. Specifically, layer 1 has ridge 519 of width W and is partially covered by SiN insulating layer 515. To maintain a single transverse mode, W is approximately 5 microns. Ridge 519 can be fabricated to extend across the entire length of the structure, i.e., covering both active semiconductor regions 50 and 51. Layers 512 and 513 are metallic contact layers.

Figure 8:
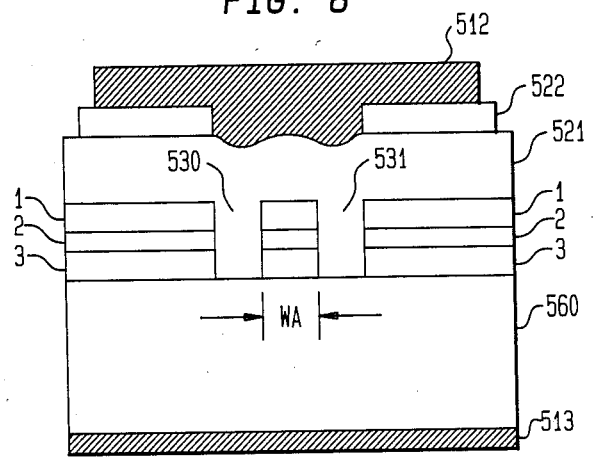
FIG. 8 shows, in pictorial form, a cross section of an active semiconductor region of an embodiment of the present invention in which a dual-channel buried heterostructure is used to provide transverse guidance of the lightwave in the active semiconductor region.

Another structure for providing transverse guidance in active semiconductor regions 50 and 51 is a dual-channel buried heterostructure. This is shown in FIG. 8. After growing layers 3, 2, and 1 on substrate 560, a pair of channels, 530 and 531, are etched to leave a mesa having width WA. Then, lower index layer 521, often InP, which serves as a confining region, is grown in the groove. Channels 530 and 531 may extend the entire length of the amplifier structure. Layers 512 and 513 are metallic contact layers; layer 560 is an n - InP substrate; layer 3 is an n - InGaAsP layer; layer 2 is a p - InGaAsP layer; layer 1 is a p - InP layer; layer 521 is a p - InP layer and layer 522 is a $SiO_2$ layer. An example of such a dual-channel buried heterostructure is shown in the *Technical Digest OFC '84 O.S.A. Meeting on Optical Fiber Communication Jan.* 23-25, 1984, paper MF2, FIG. 1, page 15.

Another well-known structure, not shown in the figures, for providing transverse guidance in active semiconductor regions 50 and 51 is a stripe-contact current injection structure.

The structures providing transverse guidance in active semiconductor regions 50 and 51 may optionally be fabricated by bombarding the areas adjacent to active semiconductor regions 50 and 51 to make them highly resistive instead of using insulating layers as previously described.

Further embodiments of the present invention can be fabricated by utilizing the novel wavelength selective structures disclosed in my U.S. Pat. No. 4,639,922 entitled "Single Mode Injection Laser Structure", issued on Jan. 27, 1987 and which is incorporated by reference herein.

Figure 9:
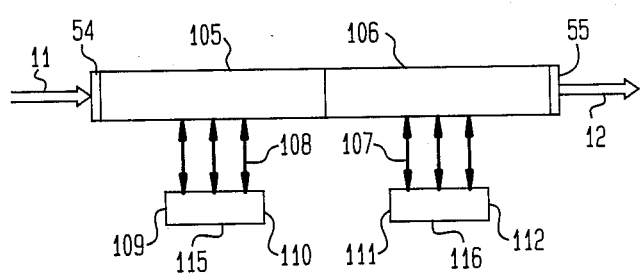
FIG. 9 shows, in pictorial form, the general structure of various embodiments of the present invention in which lightwave coupling between active semiconductor waveguides and auxiliary light guiding sections is used to provide wavelength selective gain.
Figure 10:
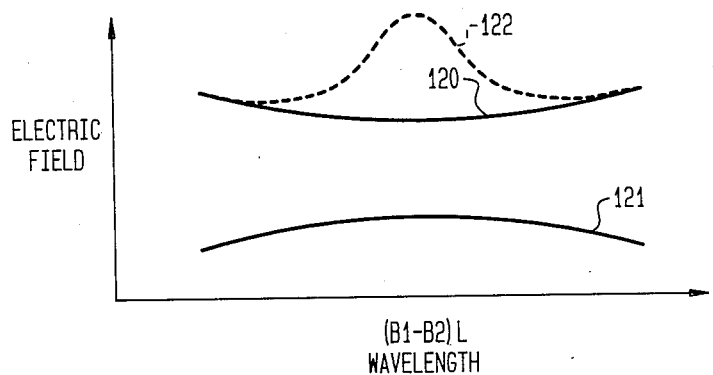
FIG. 10 shows, in graphical form, the electric fields in both an active semiconductor waveguide section and an auxiliary light guiding section of FIG. 9 which result from the lightwave coupling therebetween, as a function of wavelength.

FIG. 9 depicts the general structure of various embodiments of the present invention using a novel means to provide wavelength selective gain. In particular, this figure shows a view looking down at the top of the semiconductor amplifier structure. Active semiconductor waveguide sections 105 and 106 have anti-reflection coatings 54 and 55 disposed at the ends thereof. As indicated by arrows 107 and 108, active amplifier waveguide sections 105 and 106 and auxiliary light guiding sections 115 and 116 are situated so that light is continuously coupled from active waveguide sections 105 and 106 to auxiliary light guiding sections 115 and 116, respectively. The coupling between these sections causes notable transfer of power therebetween. If the phase constants of each pair of sections differ, the power transfer is wavelength selective. Furthermore, by making the gain of auxiliary light guiding sections 115 and 116 greater than the gain of active semiconductor amplifier waveguide sections 105 and 106, respectively, the effect can be enhanced. This is shown graphically in FIG. 10. Here, curve 120 represents the electric field in section 105 or 106 and curve 121 represents the electric field in section 115 and 116 when there is equal gain between each pair of sections. Dotted curve 122 represents the electric field in section 105 and 106 when there is larger gain in section 115 or 116. With larger gain in auxiliary light guiding section 115 or 116 than in the corresponding active semiconductor amplifier waveguide section 105 or 106, waves coupled over to the auxiliary light guiding section are amplified faster than waves in the corresponding active semiconductor amplifier waveguide section. Thus, waves which are subsequently coupled out of an auxiliary light guiding section and back into the corresponding active semiconductor amplifier waveguide section, in phase with waves in the corresponding active semiconductor amplifier waveguide section, do a more effective job of amplifying than if the gain in an auxiliary light guiding section was lower.

A larger gain in auxiliary light guiding section 115 or 116 can advantageously be obtained by pumping these sections with a larger current density than that used to pump active semiconductor amplifier waveguide sections 105 and 106. The dimensions of the two waveguide pairs, i.e., sections 105 and 115 and sections 106 and 116, are chosen to obtain the desired difference in phase constant therebetween. In FIG. 9, ends 109 and 110 of auxiliary light guide section 115 and ends 111 and 112 of auxiliary light guide section 116 are terminated in lossy absorbing regions. Hence, the photon density does not build in auxiliary light guide sections 115 and 116 to the same extent it does in active semiconductor waveguide sections 105 and 106, even for the same current density. Thus, higher gain in auxiliary light guiding sections 115 and 116 can be advantageously obtained without using a higher current density.

Specific structures for providing the coupling shown in FIG. 9 are disclosed in FIGS. 4-7 in my above-cited issued patent.

It should be clear to those skilled in the art that further embodiments of the present invention can be constructed by placement of a passive waveguide between active semiconductor regions 50 and 51 shown in FIGS. 1, 5 and 6 and between active semiconductor regions 105 and 106 shown in FIG. 9.

Figure 11:
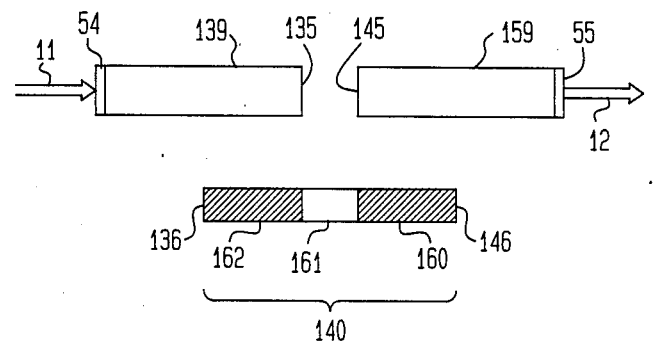
FIG. 11 shows, in pictorial form, the general structure of various embodiments of the present invention in which lightwave coupling between a portion of an active semiconductor waveguide section and the active portion of an auxiliary light guiding section is used to provide wavelength selective gain.
Figure 12:
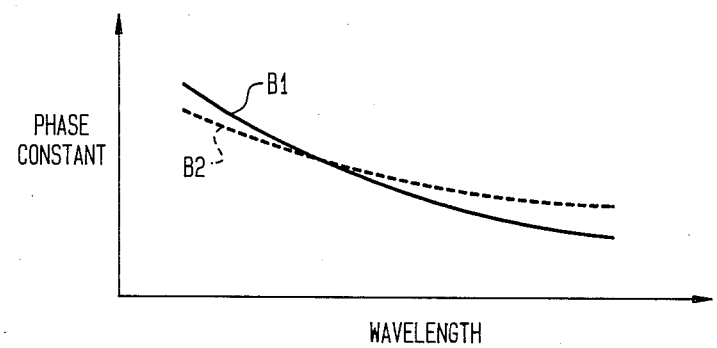
FIG. 12 shows, in graphical form, the relation between the phase constants of an active semiconductor waveguide section and an auxiliary light guiding section for the embodiment shown in FIG. 11.

FIG. 11 shows the general structure of various embodiments of the present invention, looking down at the top of the injection laser structure, in which coupling between active portions of transmission lines 139 and 140—having lossy terminations 135 and 136, respectively—and active portions of transmission lines 159 and 140—having lossy terminations 145 and 146, respectively—provides wavelength selective gain. Specifically, transmission line 140 comprises active regions 160 and 162 separated by passive region 161. Current is injected into transmission lines 139 and 159 along their entire length. Current is injected into transmission line 140 in regions 160 and 162. Anti-reflection dielectric coating 54 and 55 provide the input and output faces, respectively, for the lightwave. Transmission line pairs 139 and 161 and 159 and 160 are fabricated to have phase constants which are equal at one wavelength and unequal at all others. This is accomplished by forming transmission line structures having different transverse dimensions and from materials having different indexes of refraction. The resulting wavelength dependent phase constants of each pair are graphically shown in FIG. 12, as more fully described in my patent identified above.

The relatively broadband coupling between transmission line pairs 139 and 162 and 159 and 160 causes appreciable power transfer at a specific wavelength, but little net power transfer at other wavelengths.

Specific structures providing the desired wavelength selective coupling are disclosed in FIGS. 10-13 of my above-cited patent.

Figure 13:
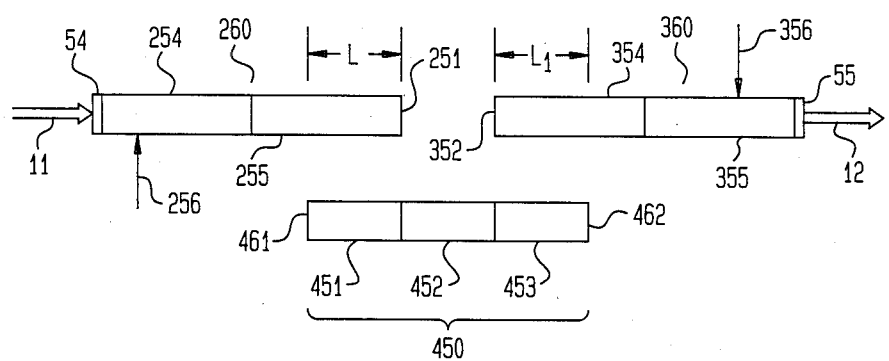
FIG. 13 shows, in pictorial form, an embodiment of the present invention in which coupling between passive regions in two pairs of transmission lines is used to provide wavelength selective gain.

FIG. 13 shows a top view of a further embodiment of the present invention which is similar to the embodiment shown in FIG. 11. Here, distributed coupling is provided between passive sections in the waveguides. Specifically, transmission line 260 has active region 254 and passive region 255. Active region 254 is pumped by injection current as shown by arrow 256. Transmission line 360 is pumped by injection current as shown by arrow 356. Transmission line 450 is a passive region made up of passive regions 451, 452, and 453. The transmission lines 260, 360 and 450 have lossy terminations, 251, 352, 461 and 462, respectively. Anti-reflection coating 54 and 55 provide the input and output faces, respectively, for the input and output lightwave signals. Transmission lines 260 and 450 are coupled to transfer energy in passive coupling regions 255 and 451 over a length L. Transmission lines 360 and 450 are coupled to transfer energy in passive coupling regions 354 and 453 over a length $L_1$. Illustratively, passive coupling regions 255, 451, 354 and 453 can be fabricated from $LiNbO_3$ or can be fabricated in a semiconductor region or larger bandgap. Furthermore, passive coupling regions 255, 451, 354 and 453 can be subjected to a variable electric field, by means of voltages applied to electrodes deposited over the passive regions in order to utilize the electro-optic effect to adjust the pass band of the amplifier. Coupling between passive waveguide sections using $LiNbO_3$ has been disclosed to the art in an article entitled "Tunable Optical Waveguide Directional Coupler Filter" by R. C. Alferness and R. V. Schmidt in *Applied Physics Letters*, Vol. 33 No. 2, 15 July 1978, p. 161. Furthermore, the wavelength selective passive coupling region pairs 255 and 451 and/or 354 and 453 may be fabricated from fused silica in order to provide excellent stability against temperature variations.

Lossy termination 251 in transmission line 260 and lossy termination 352 in transmission line 360 may be achieved by not injecting current into regions 255 and 355 in otherwise continuous structures 260 and 360, respectively.

Clearly, many other varied embodiments may be constructed by those skilled in the art without departing from the spirit and scope of the present invention.

What is claimed is:

1. An amplifier for amplifying a broadband input optical signal comprising:
   first and second active semiconductor regions having first and second ends, wherein the first and second active semiconductor regions are disposed against one another at the second ends thereof, the input optical signal being input at the first end of said first active semiconductor region and the amplified optical signal being output at the first end of the second active semiconductor region, and
   first and second means for injection pumping the first and second active semiconductor regions to produce gain over a wavelength in each, the wavelength at which the gain of the first active semiconductor region is a maximum being different than the wavelength at which the gain of the second active semiconductor region is a maximum, the wavelength regions overlapping to produce a combined gain distribution over a broader wavelength region than the wavelength regions of either the first or second active semiconductor regions alone.

2. The amplifier in accordance with claim 1 further comprising first and second anti-reflection coatings disposed on the first ends of of said first and second active semiconductor regions, respectively.

3. The amplifier in accordance with claim 1 wherein the first and second active semiconductor regions are a dual-channel buried heterostructure.

4. The amplifier in accordance with claim 1 wherein the first and second active semiconductor regions are a ridge waveguide structure.

5. The amplifier in accordance with claim 1 wherein the first and second means for injection pumping the first and second active semiconductor regions comprise means for injection pumping a variable amount of current.

6. The amplifier in accordance with claim 1 wherein a passive waveguide is disposed between the second ends of the first and second active semiconductor regions.

7. An amplifier for amplifying selected wavelengths of a broadband input optical signal comprising:
   tunable optical bandpass filtering means for passing from the input signal only signals having the selected wavelengths,
   first and second active semiconductor regions having first and second ends, wherein the first and second active semiconductor regions are disposed against one another at the second ends thereof, said tunable optical bandpass filtering means being disposed at the first end of said first active semiconductor region, the amplified optical signal being output from the first end of said second active semiconductor region, and
   first and second means for injection pumping the first and second active semiconductor regions to produce gain over a wavelength in each, the wavelength at which the gain of the first active semiconductor region is a maximum being different than the wavelength at which the gain of the second active semiconductor region is a maximum, the wavelength regions overlapping to produce a combined gain distribution over a broader wavelength region than the wavelength regions of either the first or second active semiconductor regions alone.

8. The amplifier in accordance with claim 7 further comprising first and second anti-reflection coatings disposed on said optical bandpass filtering means and the first end of said second active semiconductor region, respectively.

9. The amplifier in accordance with claim 7 wherein the tunable optical bandpass filtering means is a grating fabricated from $LiNbO_3$.

10. The amplifier in accordance with claim 9 further comprising electrodes disposed across the filtering means and a variable source of voltage is connected to the electrodes to vary the bandpass region of the filter.

11. The amplifier in accordance with claim 7 wherein a passive waveguide is disposed between the second ends of the first and second active semiconductor regions.

12. The amplifier in accordance with claim 7 wherein the first and second means for injection pumping the first and second active semiconductor regions are means for injection pumping a variable amount of current.

13. An amplifier for amplifying selected wavelengths of a broadband input optical signal comprising:
   first and second active semiconductor regions having first and second ends disposed adjacent one another at the second ends thereof, the input optical signal being input to the first end of the first active semiconductor region and the amplified optical signal being output from the first end of the second active semiconductor region,
   first and second means for injection pumping the first and second active semiconductor regions to produce gain over a wavelength region in each, the wavelength at which the gain of the first active semiconductor region is a maximum being different than the wavelength at which the gain of the second active semiconductor region is a maximum, the wavelength regions overlapping to produce a combined gain distribution over a broader wavelength region than the wavelength regions of either the first or second active semiconductor regions alone, and first and second auxiliary light guiding means disposed in a physical relationship with the first and second active semiconductor regions, respectively, so that optical energy is coupled between each auxiliary light guiding means and its corresponding active semiconductor regions in order to provide wavelength selective amplification.

14. The amplifier in accordance with claim 13 wherein said first and second auxiliary light guiding means are waveguides.

15. The amplifier in accordance with claim 14 wherein the waveguides have an active gain region and the amplifier further comprises means for injection pumping the active gain regions in the waveguides.

16. The amplifier in accordance with claim 15 wherein the waveguides have lossy terminations for optical energy.

17. The amplifier in accordance with claim 13 further comprising first and second anti-reflection coatings disposed on the first ends of said first and second active semiconductor regions, respectively.

18. The amplifier in accordance with claim 13 wherein a passive waveguide is disposed between the second ends of the first and second active semiconductor regions.

19. The amplifier in accordance with claim 13 wherein the first and second means for injection pumping the first and second active semiconductor regions are means for injection pumping a variable amount of current.

20. An amplifier for amplifying selected wavelengths of an input optical signal comprising:

first and second active semiconductor amplifier regions having first and second ends, the input optical signal being input to the first end of the first active semiconductor amplifier region and the amplified optical signal being output from the first end of the second active semiconductor amplifier region, first and second means for injection pumping the first and second active semiconductor amplifier regions to produce gain over a wavelength region in each, the wavelength at which the gain of the first active semiconductor amplifier region is a maximum being different than the wavelength at which the gain of the second active semiconductor amplifier region is a maximum, the wavelength regions overlapping to produce a combined gain distribution over a broader wavelength region than the wavelength regions of either the first or second active semiconductor amplifier regions alone, an auxiliary light guiding section comprising first and second active regions, and first and second means for providing variable gain in the first and second active regions of the auxiliary guiding section, the auxiliary light guiding section being disposed so that light energy is coupled between the first active semiconductor amplifier region and the first active region of the auxiliary section and the second active semiconductor amplifier region and the second active region of the auxiliary section to provide wavelength selective amplification.

21. The amplifier in accordance with claim 20 wherein the ends of the auxiliary light guiding section and the second ends of the active semiconductor amplifier regions are lossy terminations for light energy.

22. The amplifier in accordance with claim 21 wherein the phase constants of the first active semiconductor amplifier region and the first active region of the auxiliary light guiding section are equal at only one value of wavelength.

23. The amplifier in accordance with claim 22 where the first active semiconductor amplifier region and the first active region of the auxiliary light guiding section have different widths and indexes of refraction.

24. The amplifier in accordance with claim 20 further comprising first and second anti-reflection coatings disposed on the first ends of said first and second active semiconductor amplifier regions, respectively.

25. The amplifier in accordance with claim 20 wherein the first and second means for injection pumping the first and second active amplifier regions are means for injection pumping a variable amount of current.

26. An amplifier for amplifying selected wavelengths of an input optical signal comprising:

first and second transmission waveguides each comprising an active semiconductor region having first and second ends and a passive region having first and second ends, the second ends of the the active semiconductor regions and the passive regions in each transmission waveguide being disposed adjacent to each other, the input optical signal being input to the first end of the active semiconductor region in the first transmission waveguide and the amplified optical signal being output from the first end of the the active semiconductor region in the second transmission waveguide, first and second means for injection pumping the active semiconductor regions in each transmission waveguide to produce gain over a wavelength region in each, the wavelength at which the gain of the first active semiconductor region is a maximum being different than the wavelength at which the gain of the second active semiconductor region is a maximum, the wavelength regions overlapping to produce a combined gain distribution over a broader wavelength region than the wavelength regions of either the first or second active semiconductor regions alone, and an auxiliary light guiding section having first and second ends and comprising first and second passive regions, the auxiliary light guiding section being disposed so that light energy is coupled between the passive region in the first transmission waveguide and the first passive region in the auxiliary light guiding section and between the passive region in the second transmission waveguide and the second passive region in the auxiliary light guiding section to provide wavelength selective amplification.

27. The amplifier in accordance with claim 26 wherein the first and second ends of the auxiliary light guiding section and the first ends of the first and second transmission waveguides are lossy terminations for light energy.

28. The amplifier in accordance with claim 26 wherein the passive regions are $LiNbO_3$ layers.

29. The amplifier in accordance with claim 28 further comprising metal electrodes disposed across the passive regions and first and second variable sources of voltage are connected to the electrodes whereby the phase constants and the coupling between the passive regions may be varied.

30. The amplifier in accordance with claim 26 further comprising first and second anti-reflection coatings disposed on the first ends of said first and second transmission waveguides, respectively.

31. The amplifier in accordance with claim 26 wherein the first and second means for injection pumping the active semiconductor regions in each transmission waveguide are means for injection pumping a variable amount of current.

* * * * *

UNITED STATES PATENT AND TRADEMARK OFFICE
CERTIFICATE OF CORRECTION

PATENT NO.  : 4,794,346

DATED       : December 27, 1988

INVENTOR(S) : Stewart E. Miller

It is certified that error appears in the above-identified patent and that said Letters Patent is hereby corrected as shown below:

Column 2, line 16, after "in" delete "active semiconductor region and the combined gain distribution of the structures shown in".
Column 3, line 40, change "distrubution" to --distributions--.
Column 4, line 22, change "$SiO_3$" to --$SiO_2$--.

Signed and Sealed this

Twenty-seventh Day of August, 1991

Attest:

HARRY F. MANBECK, JR.

Attesting Officer

Commissioner of Patents and Trademarks